United States Patent
Stevens et al.

(10) Patent No.: US 8,872,246 B1
(45) Date of Patent: Oct. 28, 2014

(54) MEMRISTOR USING A TRANSITION METAL NITRIDE INSULATOR

(71) Applicant: Sandia Corporation, Albuquerque, NM (US)

(72) Inventors: James E. Stevens, Albuquerque, NM (US); Matthew Marinella, Albuquerque, NM (US); Andrew John Lohn, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/750,451

(22) Filed: Jan. 25, 2013

Related U.S. Application Data

(60) Provisional application No. 61/591,162, filed on Jan. 26, 2012.

(51) Int. Cl.
*H01L 21/336* (2006.01)

(52) U.S. Cl.
USPC ........... 257/296; 257/2; 257/4; 257/8; 257/99

(58) Field of Classification Search
USPC .............. 257/2, 4, 295, 314, 296, 306, 532; 438/393, 250, 532
See application file for complete search history.

(56) References Cited

U.S. PATENT DOCUMENTS

| 7,763,880 | B2 | 7/2010 | Williams | |
|---|---|---|---|---|
| 2008/0090337 | A1 | 4/2008 | Williams | |
| 2008/0128772 | A1* | 6/2008 | Senzaki | 257/296 |
| 2011/0121359 | A1 | 5/2011 | Yang et al. | |

OTHER PUBLICATIONS

Byung Joon Choi et al., Nitride Memristors, Appl Phys A (2012) 109:1-4.

* cited by examiner

*Primary Examiner* — Dung A. Le
(74) *Attorney, Agent, or Firm* — Martin I. Finston

(57) ABSTRACT

Apparatus is disclosed in which at least one resistive switching element is interposed between at least a first and a second conducting electrode element. The resistive switching element comprises a metal oxynitride. A method for making such a resistive switching element is also disclosed.

15 Claims, 1 Drawing Sheet

MEMRISTOR USING A TRANSITION METAL NITRIDE INSULATOR

CROSS-REFERENCE TO RELATED APPLICATION

This application claims the benefit of U.S. Provisional Application Ser. No. 61/591,162 filed Jan. 26, 2012, which is incorporated herein by reference.

STATEMENT OF GOVERNMENT INTEREST

This invention was developed under Contract DE-AC04-94AL85000 between Sandia Corporation and the U.S. Department of Energy. The U.S. Government has certain rights in this invention.

TECHNICAL FIELD

The present invention is directed generally to electrical and electronic devices that exhibit resistive switching.

BACKGROUND OF THE INVENTION

A resistive switching element is a circuit element whose electrical resistance is determined by its previous current-voltage history in such a way that an applied voltage of sufficient magnitude can switch it between a high-conductance state and a low-conductance state. The term "memristor" or the term "resistive random access memory" (ReRAM or RRAM) is often used to refer to a passive two-terminal resistive switching element fabricated with a thin insulating film sandwiched between two conductors.

Memristors are among the most promising emerging memory devices to replace flash, DRAM, and possibly SRAM. The desirable analog behavior of memristors may also make them a candidate for neuromorphic circuit applications. Currently known types of memristors are believed to work because large-signal voltages (typically >1 V) across the device may be used to shift the spatial distribution of the dopant ions in the insulator, which in turn acts to change the small-signal (typically <1 V) resistance of these devices.

The insulating materials used until now in memristors are generally transition-metal oxide (TMO) films containing mobile oxygen ions and oxygen vacancies, such as $TiO_2$, $Ta_2O_5$, $WO_3$, $HfO_2$, NiO, and $Nb_2O_5$. Electrodes are typically made from electrically conductive metals. In many instances, a pair of metals is favored for the respective electrodes, in which one metal more readily reduces the insulator material than the other.

Materials choices may, however, be constrained by compatibility requirements when it is desired, e.g., to integrate memristors with CMOS integrated circuits. For that reason, there remains a need for further designs for memristors that use CMOS-compatible materials.

SUMMARY OF THE INVENTION

An exemplary embodiment of the present invention in apparatus comprises at least one resistive switching element interposed between at least a first and a second electrode element, wherein said resistive switching element comprises a metal oxynitride.

It is to be understood that both the foregoing general description and the following detailed description are exemplary, but are not restrictive, of the invention.

DETAILED DESCRIPTION

Aluminum nitride (AlN) is a CMOS-compatible material that is well known in the art because its large piezoelectric coefficient makes it useful for surface and bulk acoustic wave applications. Typical AlN parameters include a band gap of 6.2 eV, an index of refraction of 2.08, a dielectric constant of 8.6, a high thermal conductivity of 170 W/m/K, and a columnar grain structure.

One-time conductance changes in AlN have been reported previously. The observed conductance switching in that case was attributed to charge injection into a relatively thick (45 nm) AlN insulating film, leading to charging of aluminum nano-crystals embedded in the AlN.

We have discovered that a circuit element exhibiting resistive switching that is stable over many current-voltage cycles can be made, in which the switchable insulating film has a composition that comprises aluminum oxynitride (AlNO), and that in embodiments is derived from an AlN film. We believe that this is the first demonstration of a valence-change memristive device with a switching layer based on nitride or nitroxide rather than a metal oxide.

Figure 1:
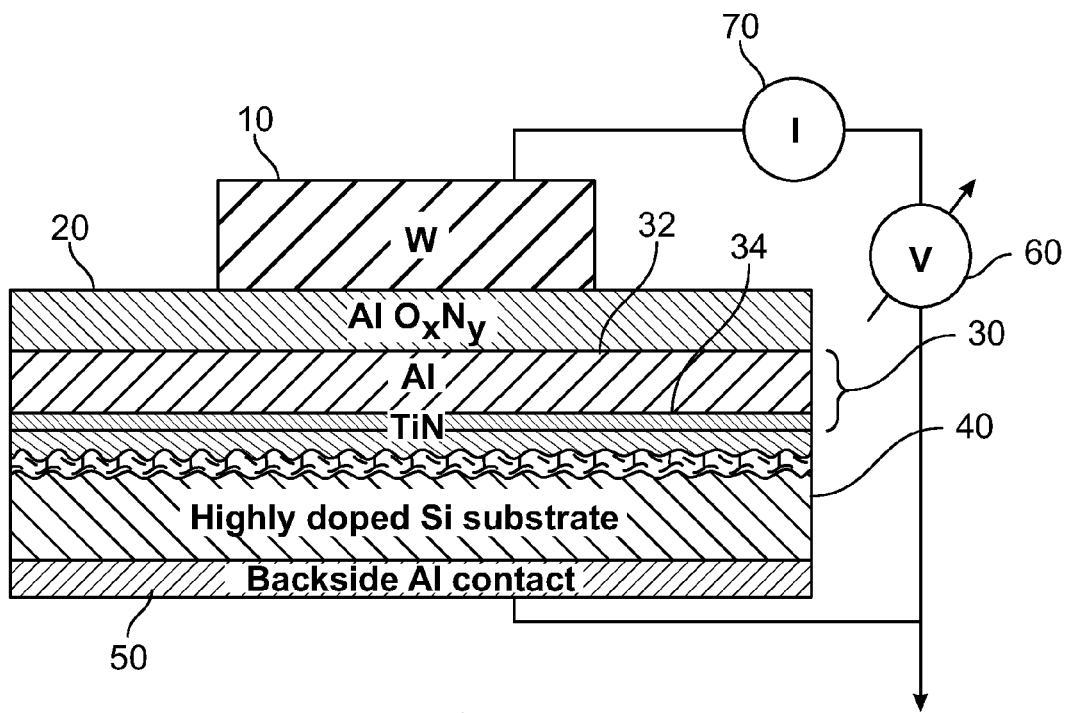
FIG. 1 provides a schematic cross-sectional view, not to scale, of a resistive switching device according to an illustrative embodiment of the invention.

FIG. 1 provides a cross-sectional view of an illustrative embodiment, which includes top electrode 10, switchable insulating layer 20, and bottom electrode 30, which in this illustrative example comprises an aluminum (Al) layer 32 and a titanium nitride layer 34. The memristor is formed on a substrate 40 of highly doped silicon, and electrical contact is made to the back side of substrate 40 by means of an aluminum contact layer 50. Layer 34 of titanium nitride (TiN) is a conductive adhesion layer between the aluminum and doped silicon layers.

Shown schematically in the figure is a variable voltage source 60 in series with a current-measuring device 70.

The top electrode in our illustrative example is composed of tungsten (W). However, it will be understood that various alternative conducting materials could be used for the top and/or bottom electrodes, including gold, platinum, iridium, nickel, titanium nitride, and tantalum.

We fabricated prototypes of the device of FIG. 1 in a simple dot capacitor geometry by conventional CMOS techniques. The film stack, in sequence from top to bottom, was: W (500 nm)/AlN (10 nm)/Al (100 nm)/TiN (25 nm). The thicknesses specified here are merely exemplary and not limiting. For example, in comparative studies, we varied the AlN thickness over the range 10-50 nm.

For the AlN switchable insulating layer, we believe that an effective range would have a lower limit of 2 nm. If the film thickness were below this value, the conductive behavior of the film could be dominated by tunneling as well as non-switchable effects due to oxygen mobility, which could both defeat the desired switching behavior.

An upper limit for the effective range might depend on the method for introducing oxygen to the switchable insulating layer. If the oxygen is introduced by way of surface oxidation only, we believe an upper limit would be about 100 nm. For film thicknesses above this range, we believe that switching to a low-resistance state might in most cases be unfeasible for reasons discussed below. However, effective layers having still greater thicknesses may be achievable using other methods of oxygen introduction, as also discussed below.

Starting from a highly p-doped silicon wafer, the TiN was deposited by reactive sputtering, the Al was deposited by sputtering, the AlN was deposited by reactive sputtering of the same aluminum target, both at 350 C, and the tungsten was deposited by chemical vapor deposition (CVD) at 450 C. Stress in the AlN film was controlled by the radiofrequency (RF) power applied to the silicon wafer substrate during deposition. As those skilled in the art will appreciate, various alternative deposition methods may be useful in this regard, which collectively include sputtering, CVD, ALD, and evaporation.

The top tungsten layer was patterned with photoresist and etched in a downstream plasma etch tool using a nitrogen trifluoride/argon gas mixture to remove it in selected areas. The test device areas of the 10-nm AlN devices were $2.5 \times 10^3$ $\mu m^2$. More generally, we tested devices of areas ranging from $2.5 \times 10^3$ to $10^4$ $\mu m^2$. Devices having areas substantially smaller than $2.5 \times 10^3$ $\mu m^2$ could also readily be made if desired.

We exposed the AlN film to air before depositing the top tungsten layer. We believe that the atmospheric exposure caused oxygen to be incorporated into the AlN to some depth, thereby forming at least a shallow surface layer of AlNO.

Our understanding of the oxidative effects is informed by the work of others. For example, S. Kumar and T. L. Tansley, "Low-temperature growth and measurement of oxygen in reactively sputtered AlN thin films", *Jpn. J. Appl. Phys.* 34 (1995) 4154 have noted that AlN thin films are prone to oxidation and reported oxygen levels incorporated into AlN films comparable to the nitrogen level. On the other hand, T. K. Hatwar and T. R. Pian, "Surface studies of aluminum nitride thin films", *Mater. Res. Soc. Symp. Proc.,* 121, (April 1988) 557-560 reported that a graded oxygen-rich layer is limited to the top 10 nm of the AlN surface and prevents further oxygen penetration into the AlN, even at 600° C. and above. Moreover, M. Yamashita, Y. Sasaki, H. Ito, H. Ohsato, and N. Shibata, "Fabrication of aluminum nitride thin film and its oxidation behavior", *J. Soc. Materials Science Japan,* 55, no. 8 (2006) 785-89 reported bulk AlN to be a good oxygen barrier.

For those reasons, among others, our current belief is that our atmospheric exposure step most likely created a surface layer of AlNO a few nanometers thick, with possible decreasing, graded penetration to greater depths into the AlN film. However, we do not believe that such a pronounced localization of the oxygen content is essential for the resulting memristor to be operative. On the contrary, we believe that it would be operative even if the oxygen distribution were uniform throughout the film. We discuss these factors in further detail below.

We also note that prior to the CVD deposition of tungsten described above, the wafer was exposed to hydrogen gas according to conventional techniques. As a consequence, hydrogen could also have been incorporated into the AlN layer. Although we do not currently believe that the presence of hydrogen is essential for the memristor to be operative, we wish to point out that mobile hydrogen is known to be useful for passivating free charges in semiconductor devices. Therefore, the presence of hydrogen should not be excluded as a possible factor that affects the performance of the resulting device.

For the electrical characterization of our test devices, we performed current-voltage (I-V) measurements using an Agilent 4156C semiconductor parameter analyzer. The positive probe contacted the device top surface and the ground probe contacted the wafer backside. Resistive switching behavior was identified in these devices by sweeping voltage and measuring current. Such behavior is characterized by switching between high and low resistance states when the magnitude of the voltage exceeds a threshold, while maintaining a constant (high or low) resistance for some range of voltages lying between the respective positive and negative thresholds.

Figure 2:
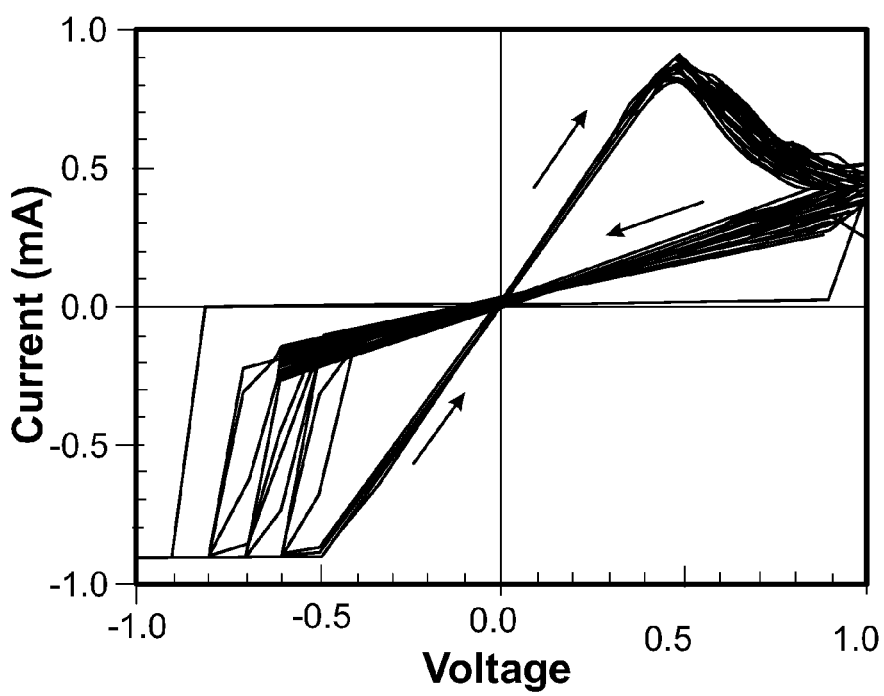
FIG. 2 provides a current-voltage (I-V) curve that exhibits bipolar switching behavior observed experimentally in a device having a configuration as represented in FIG. 1.

Memristors typically exhibit bipolar switching behavior, which is characterized by an I-V curve that exhibits a hysteresis loop or "FIG. 8" curve. Thus, for example, FIG. 2 is the result of 100 switching cycles for one of our test devices. In each cycle, the applied voltage was swept between positive and negative voltage extremes.

It will be seen that the I-V traces of FIG. 2 have an anti-figure-8 polarity. That is, in the constant-resistance portions (i.e., the linear portions where $-0.4<V<+0.4$) of the sweep, the magnitude of the electric current is greater (i.e. the resistance is lower) in the positive-going half-cycle (i.e., for $-0.4V \rightarrow +0.4V$), and the current magnitude is lower in the negative-going half cycle (i.e., for $+0.4V \rightarrow -0.4V$).

Such a polarity indicates that the switching is occurring at the top (tungsten-AlN) interface, and that the ohmic interface is at the bottom AlN surface. This behavior could be explained by a model in which positively charged mobile oxygen vacancies are repelled from the top interface during positive voltage sweeps and attracted to the top interface during negative sweeps. The same behavior could also be explained by an alternative model in which negatively charged oxygen ions are attracted to the top interface during positive voltage sweeps.

Electroforming is a known technique that has been used to condition newly fabricated memristors so as to fix their final high-resistance and low-resistance states. An electroforming step is often required prior to memristors settling into their final resistance range.

We electroformed our 10-nm AlN devices using a positive voltage sweep from 0V to about +2.0V with a current compliance selected in the range 0.1-0.3 mA. The current compliance is a specified ceiling on the absolute value of the current that can be supplied. In the electroforming of typical devices, we saw the current rapidly rise to the compliance value when the sweep reached about +1.85V.

The electroforming step switched the device from a high-resistance ("high-R") initial state to a medium-R state which we identify as the OFF state. A negative sweep then switched the device to a low-R state which we identify as the ON state. Subsequently, we were able to switch the devices off and on with voltages of magnitudes between 0.7V and 1.5V and currents below 1-10 mA, in which the variations were due to differences among the samples tested.

The measurements reported in FIG. 2 and further measurements confirmed that devices made as described here can maintain their resistance states for small voltage swings, i.e., for voltages whose magnitudes lie below the switching thresholds. Consequently, the resistance state that a device is in at a given time (i.e., its ON or OFF state, or even an intermediate resistance state) can be determined without changing that state. Hence a logical value can be stored in the device and read from it without an erasure of that value.

In our investigations, we found that devices with relatively thick AlN layers, i.e. layers 30-50 nm thick, tended to behave as insulators and exhibited typical breakdown voltages ranging from 5V-12V. Voltage sweeps at these high levels typically broke down the insulator and left the device in a permanently conducting state. We found it difficult to achieve repeatable memristive behavior with these relatively large AlN layer thicknesses. According to our current belief, the absence of resistive switching for these thicker films (i.e., those with a film thickness greater than 30 nm) is probably attributable to the method of passive oxidation that we used to introduce oxygen into the AlN surface. We consider it likely that thicker films would show resistive switching if the oxygen were co-deposited in an aluminum oxynitride (AlON) deposition process so as to include oxygen throughout the bulk of the AlON film.

The I-V trace in FIG. 2 represents one hundred switching cycles. It will be seen that the trace is substantially linear at voltage magnitudes below the switching voltage ($|V|<0.4$). One probable inference from this behavior is that the top interface, i.e. the AlN-tungsten interface, does not behave as a Schottky-barrier tunneling junction.

We have conducted early-stage investigations, but do not have a definitive model to explain the switching mechanism in our AlN-based devices. We believe that mobile nitrogen is unlikely to explain the switching behavior, because nitrogen is almost immobile in ionic nitrides. Although redox reaction cycles have been proposed to account for formation and dissipation of conducting channels in insulators, we think this is also unlikely as an explanation because both AlN and alumina are stable compounds.

We attempted to measure the oxygen content of our 10-nm AlN films by Rutherford backscattering (RBS), but those results indicated that the oxygen content was below the approximately 5% detection limit.

We also examined a blanket 11-nm AlN layer deposited on a substrate of silicon nitride (SiN). Transmission electron microscopy (TEM) revealed a 2.5-nm oxide layer on the surface of the AlN. An anneal in oxygen at 800 C increased the thickness of the oxide layer to only 4 nm. This result agrees with the studies we have cited above that found that AlN is relatively impervious to oxygen.

However, electron energy-loss spectroscopy (EELS) performed in conjunction with our TEM measurements indicated an oxygen content of about 10%-20% throughout the deposited AlN layer. Our current supposition is that this incorporated oxygen provides the mobile ions that support the memristive switching behavior reported here. The absence of switching behavior in the thicker layers, where oxygen is limited to a surface layer and substantially excluded from the bulk material, provides support for this supposition.

Our experimental observations suggest that switching behavior can be activated in an AlN layer by introducing oxygen in various ways. In our reported method, the oxygen was introduced through passive oxidation of the as-formed AlN layer. Although our EELS measurements indicated substantial penetration of oxygen throughout the AlN layer, we believe that the AlN layer, if thin enough, would exhibit switching behavior even if the oxygen were substantially confined to a surface layer of only a few nanometers as indicated by our TEM measurements. Of course gradients in the oxygen distribution, from a peak at the surface to lower concentrations at greater depth, may be expected in both instances.

Alternatives to passive oxidation include active procedures such as annealing in an oxygen atmosphere or reacting in an oxygen-containing plasma. Other alternatives include forming an oxynitride in situ by co-depositing aluminum together with species that, together, comprise both nitrogen and oxygen.

If oxygen is introduced by co-deposition, or if, e.g., alternating layers of aluminum nitride and aluminum oxide are formed so that the oxide is distributed in the bulk of the film and not confined to a thin surface layer, effective switching might be achievable even in films substantially thicker than 100 nm.

It should also be noted that the scope of our invention should not be understood as limited to devices whose switching layers are based on aluminum nitride, but rather, it should be understood as extending to those whose switching layers are based on oxynitrides of transition metals and their alloys, and still further to oxynitrides of other metals and metal alloys. Thus, for example, we believe that substituting titanium oxynitride in place of aluminum oxynitride, or even providing a combination of titanium oxynitride and aluminum oxynitride, would also result in a device that exhibits resistive switching behavior.

What is claimed is:

1. Apparatus, in which a path for electric current has at least one state of higher conductance and at least one state of lower conductance, comprising at least one switching layer interposed in said path between at least a first and a second conducting electrode element, wherein said switching layer comprises a metal oxynitride and is switchable between said states.

2. Apparatus of claim 1, wherein at least one of the electrode elements comprises aluminum, titanium, titanium nitride, or tungsten.

3. Apparatus of claim 1, wherein the switching layer comprises aluminum oxynitride and/or titanium oxynitride.

4. Apparatus of claim 1, wherein the switching layer is at least 2 nm in thickness.

5. Apparatus of claim 1, wherein the switching layer is at least 2 nm, but not more than 100 nm, in thickness.

6. Apparatus of claim 1, wherein the switching layer is the product of exposing an aluminum nitride film to an oxidizing atmosphere.

7. Apparatus of claim 1, wherein at least a portion of the switching layer comprises an oxynitride of aluminum or titanium, having an oxygen mole fraction of at least 5%.

8. Apparatus of claim 1, wherein at least one of the electrode elements is in direct contact with a portion of the switching layer composed of the metal oxynitride.

9. Apparatus of claim 1, wherein oxygen is distributed in the switching layer such that at least one near-surface region of the switching layer adjacent a corresponding one of the electrode elements consists of a metal oxynitride containing a sufficient mole fraction of oxygen to inject oxygen anions into deeper portions of the switching layer under stimulation by a voltage of sufficient magnitude.

10. A method for fabricating a resistive switching device, comprising:
   forming a first conductive metal layer on a substrate;
   forming a switching layer comprising a metal oxynitride over the first conductive metal layer in conductive electrical contact therewith; and
   forming a second conductive metal layer over the switching layer in conductive electrical contact therewith;
   wherein said layers are formed such that a path for electric current having at least one state of higher conductance and at least one state of lower conductance is defined between the first and second conductive metal layers.

11. The method of claim 10, wherein forming the switching layer comprises:
   depositing a metal nitride layer; and
   exposing the deposited metal nitride layer to an oxygen-containing atmosphere.

12. The method of claim 10, wherein forming the switching layer comprises co-depositing at least one metal with species that comprise oxygen and nitrogen.

13. The method of claim 10, wherein forming the switching layer comprises depositing a layer of aluminum nitride and partially oxidizing the deposited aluminum nitride layer to form said metal oxynitride.

14. The method of claim 10, wherein forming the switching layer comprises depositing a layer of aluminum oxynitride.

15. The method of claim 10, further comprising electroforming the switching layer with a voltage sweep applied across the switching layer that reaches sufficient magnitude to cause said layer to stably exhibit a current-voltage curve of a form that is characteristic of bipolar switching.

* * * * *